United States Patent
Kim et al.

(10) Patent No.: US 12,014,902 B2
(45) Date of Patent: Jun. 18, 2024

(54) SYSTEM AND METHOD OF CLEANING PROCESS CHAMBER COMPONENTS

(71) Applicant: Applied Materials, Inc., Santa Clara, CA (US)

(72) Inventors: Jong Yun Kim, Hwaseong-si (KR); Kim Seong Sim, Singapore (SG); Roman M. Mostovoy, San Francisco, CA (US); Won Ho Sung, Asan-si (KR); Pei-Chia Chen, Tokyo (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/887,992

(22) Filed: Aug. 15, 2022

(65) Prior Publication Data
US 2024/0055230 A1 Feb. 15, 2024

(51) Int. Cl.
*H01J 37/32* (2006.01)
*C23C 16/44* (2006.01)
*C23C 16/458* (2006.01)
*C23C 16/52* (2006.01)

(52) U.S. Cl.
CPC ...... *H01J 37/3244* (2013.01); *C23C 16/4405* (2013.01); *C23C 16/4583* (2013.01); *C23C 16/52* (2013.01); *H01J 37/32357* (2013.01); *H01J 37/32862* (2013.01); *H01J 37/32477* (2013.01); *H01J 2237/24507* (2013.01); *H01J 2237/3321* (2013.01)

(58) Field of Classification Search
CPC ............ H01J 37/3244; H01J 37/32862; C23C 16/4405
See application file for complete search history.

(56) References Cited

U.S. PATENT DOCUMENTS

| 6,461,435 | B1 | 10/2002 | Littau et al. |
| 7,722,719 | B2 | 5/2010 | Lei et al. |
| 2003/0159711 | A1 | 8/2003 | Blonigan et al. |

(Continued)

FOREIGN PATENT DOCUMENTS

| EP | 0843347 A2 | 5/1998 |
| JP | 2009239082 A | 10/2009 |

(Continued)

OTHER PUBLICATIONS

International Search Report and Written Opinion for Application No. PCT/US2019/043672 dated Nov. 11, 2019.

(Continued)

*Primary Examiner* — Natasha N Campbell
(74) *Attorney, Agent, or Firm* — Patterson + Sheridan, LLP (57) ABSTRACT

Embodiments described herein relate to process systems for cleaning semiconductor process chamber components. The process systems include a process chamber having process chamber components. The process chamber components include a substrate support disposed within a chamber volume of the process chamber. A gas distribution assembly faces the substrate support. A gas baffle is fluidly coupled to the gas distribution assembly. A sensor system is coupled to the process chamber and is configured to monitor at least one characteristic of the volume of the process chamber. A dynamic gas assist is fluidly coupled to the gas baffle and is communicatively coupled to the sensor.

19 Claims, 9 Drawing Sheets

(56) References Cited

U.S. PATENT DOCUMENTS

| | | |
|---|---|---|
| 2005/0199184 A1 | 9/2005 | Murugesh et al. |
| 2007/0022952 A1 | 2/2007 | Ritchie et al. |
| 2013/0004681 A1 | 1/2013 | Tso et al. |
| 2015/0167705 A1 | 6/2015 | Lee et al. |
| 2016/0084400 A1 | 3/2016 | Sankarakrishnan et al. |
| 2017/0338134 A1* | 11/2017 | Tan .................. H01L 21/67109 |
| 2021/0292894 A1 | 9/2021 | Peng et al. |

FOREIGN PATENT DOCUMENTS

| | | | |
|---|---|---|---|
| JP | 2015078418 A | 4/2015 | |
| KR | 20080071342 A | 8/2008 | |
| TW | 201001594 A | 1/2010 | |
| TW | 201528405 A | 7/2015 | |

OTHER PUBLICATIONS

Taiwan Office Action for Application No. 108126903 dated Sep. 16, 2020.
Nternational Search Report dated Nov. 7, 2023 for Application No. PCT/US2023/028723.

* cited by examiner

SYSTEM AND METHOD OF CLEANING PROCESS CHAMBER COMPONENTS

BACKGROUND

Field

Embodiments of the present disclosure generally relate to systems and method for cleaning process chamber components.

Description of the Related Art

During semiconductor devices processing, volatile precursors are introduced to process chambers to deposit conformal materials onto substrates disposed within a volume of the process chamber. The films include materials such as polysilicon, silicon dioxide, silicon nitride, and other silicon based material. The volatile precursors can also cause films to be deposited on other process chamber components and surfaces, such as chamber walls.

Deposits can build up over time on process chamber components and surfaces leading to particulates and potential contamination on fabricated devices. In order to reduce particulates generation from chamber component deposition, process chambers must be cleaned to remove process deposition build up.

Periodic cleanings of process chambers are performed to remove processing by-products from process chamber walls and interior chamber components deposited. Removal of process chamber deposits is achieved through introduction of inert or reactive cleaning gases which can chemically react or bombard with surface film deposits. However, conventional methods and apparatus do not provide a desired level of cleaning.

Accordingly, there is a need in the art for an improved method and apparatus for improving process chamber cleaning performance.

SUMMARY

In some embodiments, a system is provided. The system includes a process chamber having a substrate support disposed within a chamber volume of the process chamber. A gas distribution assembly faces the substrate support. A gas baffle is fluidly coupled to the gas distribution assembly. A sensor is coupled to the process chamber and is configured to monitor at least one characteristic of the volume of the process chamber. A dynamic gas assist is fluidly coupled to the gas baffle and is communicatively coupled to the sensor.

In some embodiments, an apparatus for distributing cleaning gases to a process volume of a semiconductor process chamber is provided. The apparatus includes a movable body disposed within a housing. The housing is concentric with the movable body. A split wing bisects the movable body and is movable along an axis perpendicular to the longitudinal axis of the movable body. A barrier plate is coupled to the movable body and disposed adjacent to the split wing.

In some embodiments, a method of cleaning semiconductor deposition chamber components is provided. The method includes providing a cleaning gas to a process volume of a process chamber using a first operating condition. The process chamber includes the chamber components. The method includes detecting a characteristic indicative of reaction between the cleaning gas and a composition disposed one or more chamber components. The method includes adjusting the first operating condition based on the characteristic. The first operating condition includes a gas flow distribution of the cleaning gas within one or more zones of the process volume.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally provide apparatus and methods for supporting a gas baffle in a processing chamber. The disclosure will be described below in relation to a plasma enhanced chemical vapor deposition (PECVD) chamber. It is to be understood that the disclosure has applicability in other chambers that are not depicted in the Figures.

Figure 1:
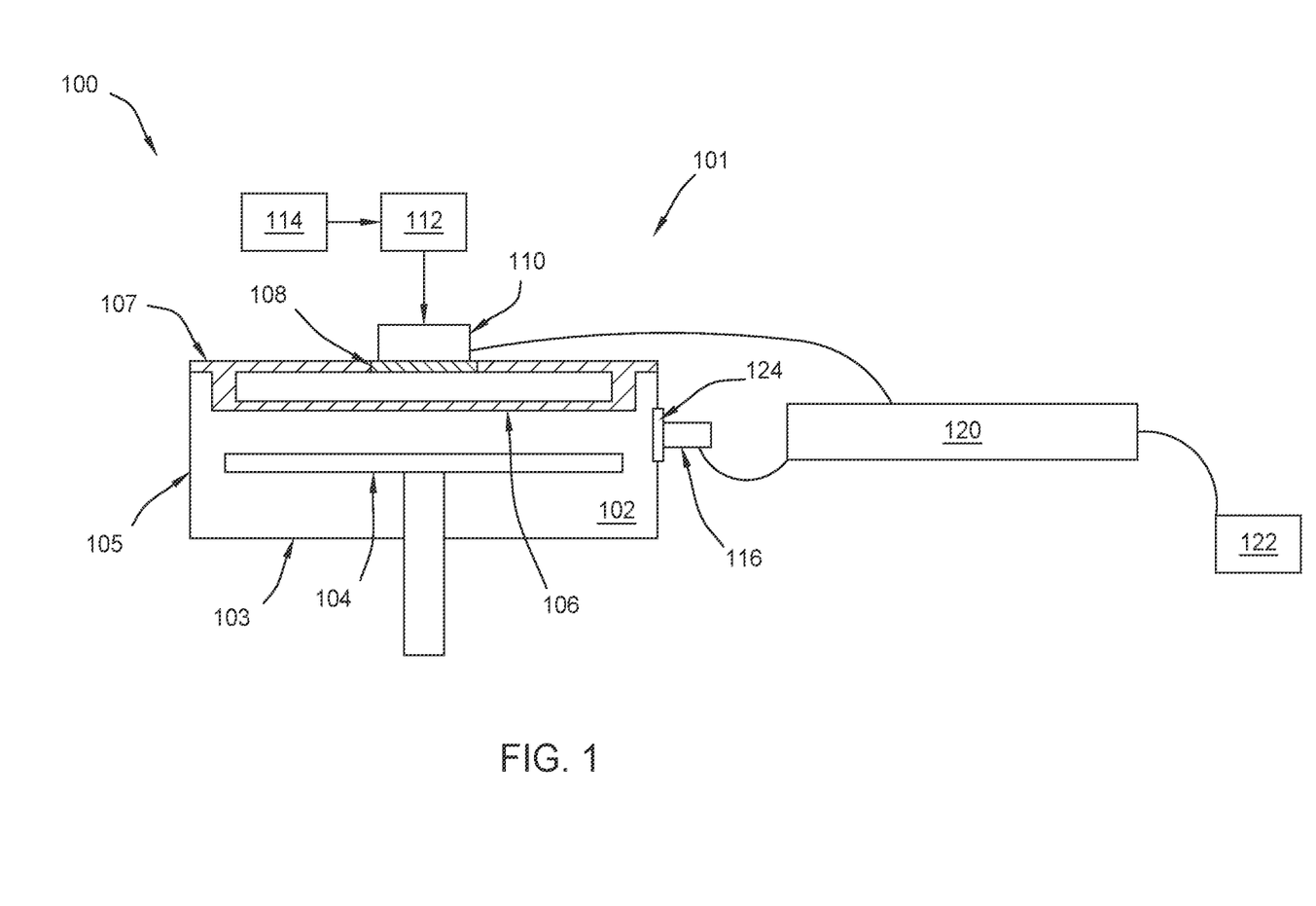
FIG. 1 schematically illustrates a process system that be used to perform the process methods described herein.

FIG. 1 schematically illustrates a process system 100 that be used to perform the process methods described herein. Here, the process system 100 is configured to provide process conditions for processing substrates and for cleaning an interior of the process chamber 101. The process chamber 101 is suitable for PECVD processes for fabricating circuitry on a large area substrate made of glass, a polymer, or other suitable substrate. The chamber 101 is configured to form structures and devices on the large area substrate for use in the fabrication of liquid crystal displays (LCD's) or flat panel displays, photovoltaic devices for solar cell arrays, or other structures. The structures may be a plurality of back channel etch inverted staggered (bottom gate) thin film transistors which may comprise a plurality of sequential deposition and masking operations. Other structures may include p-n junctions to form diodes for photovoltaic cells. The process system 100 is also capable of cleaning residues that can be deposited on process chamber components during PECVD processes.

As shown in FIG. 1, the process system 100 includes a process chamber 101 having a process volume 102, a remote plasma source 112, and a gas source 114. A plurality of chamber components can be disposed within or form the process volume 102, such as a chamber bottom 103, at least one chamber side wall 105, a substrate support 104, and a gas distribution assembly 106. A gas baffle 108 is disposed over the gas distribution assembly 106 and is configured to direct gases through the gas distribution assembly 106 and to the process chamber interior surfaces and components. A dynamic gas assist 110 is disposed over, and fluidly coupled to the gas baffle 108. The dynamic gas assist 110 is communicatively coupled to a sensor controller 120. In some embodiments, the sensor controller 120 is communicatively coupled to a central processing unit (CPU) 122. The sensor controller 120 is communicatively coupled to a sensor 116, such as a photo sensor. The sensor 116 is configured to monitor at least one characteristic of the process volume 102, such as an optical characteristic. In some embodiments, the sensor 116 is installed on a view window 124.

In some embodiments, cleaning process chambers of deposited by-products includes ionizing fluorine containing gases with the remote plasma source 112 to fluorine radicals and then flowing the radicals into the process chamber 101 to clean the interior and components of the process chamber. Example cleaning gases include oxygen-containing gases such as oxygen and/or ozone, as well as fluorine containing gases such as $NF_3$, chlorine-containing gases, or combinations thereof.

When fluorine radicals react with film deposited on process chamber walls during $NF_3$ cleaning, visible light is emitted. When the reaction terminates, the light fades and is no longer visible. The film can be a silicon-containing film, such as silicon oxide, silicon nitride, silicon oxynitride, or amorphous silicon. Conventional methods for $NF_3$ in-situ plasma cleaning rely on human observation of the visible light to determine cleaning end points. Once the light is no longer visible, the cleaning process can be ceased. As such, process chambers are often either over cleaned, which can lead to damage to the chamber parts, or under cleaned, which can lead to deposition particles flaking from the chamber wall and interfering substrate processing.

Without being bound by theory, it is believed that cleaning rate uniformity can often be challenging due to varying factors, process chamber designs, process chamber sizes, and differences in various remote plasma sources that can be used for the process chamber. In some embodiments, the rate and uniformity of cleaning of the process chamber can be affected by local factors, such as gas flow rate, pressure, power, and gas component ratio. In some embodiments, global factors that can affect the rate and uniformity of cleaning of the chamber include gas distribution assembly design and whether or not a mask sheet is used. Convention processes have included increasing gas flow rates to increase cleaning effect or throttling valves to create pressurized gas flow (e.g., 1500 Torr). Increasing gas flow rate and throttling valves can waste expensive gases, such as nitrogen trifluoride, can be harsh to chamber components, or can be ineffective in certain situations. Moreover, conventional processes do not allow for tuning of cleaning to process volume zones having different cleaning requirements. The systems described herein provide tuning of cleaning gas conditions which reduces an amount of cleaning gas used, prevents damage to chamber components, and enhances cleaning.

Figure 2A:
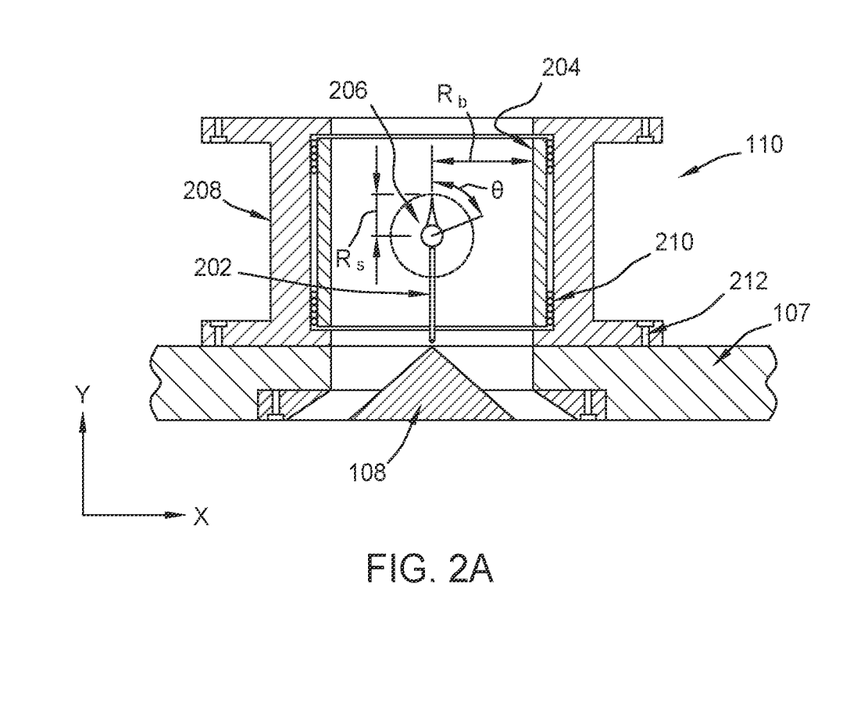
FIG. 2A schematically illustrates a first side view of a dynamic gas assist, according to some embodiments.

FIG. 2A schematically illustrates a first side view of a dynamic gas assist 110, according to some embodiments. The dynamic gas assist 110 described herein is capable of dynamically controlling cleaning gas flow rate and direction from the remote plasma source 112 to adapt to changing local and global factors. The dynamic gas assist 110 is controlled using the sensor feedback system which is communicatively coupled to the sensor 116. The sensor 116 monitors an intensity of light that is indicative of an end point for cleaning, such as visible light (e.g., having wavelength of about 380 nm to about 740 nm), such as blue light (e.g., having wavelength of about 430 nm to about 500, green light (e.g., a wavelength of about 520 nm to about 565 nm), yellow light (e.g., a wavelength of about 565 nm to about 590 nm), or combinations thereof. In some embodiments, the sensor 116 is a photosensor such as a cadmium sulfide (CdS) sensor. Any sensor 116 that is capable of detecting light having wavelengths that are visible to human eyes are contemplated. Although a single sensor 116 is shown in FIG. 2A, additional sensors are also contemplated such as about 2 to about 10 sensor, such as about 3 sensors to about 5 sensors that are directed to different zones of the process volume. One or more of the zones can be overlapped.

In some embodiments, the dynamic gas assist 110 includes a split wing 206 and barrier plate 202 formed within a movable body 204 that is further enclosed within an outer housing 208. The movable body 204 is coupled to the outer housing 208 such that the movable body 204, split wing 206, and barrier plate 202 may be rotated within the outer housing 208 along the longitudinal axis (e.g., axis passing through a center of the outer housing parallel to the Y-axis). The movable body 204 is spaced apart from the outer housing 208 with one or more spacers 210. The one or more spacers 210 provides a magnetic seal so that the movable body 204 can rotate relative to the outer housing 208. The outer housing 208 is concentric with the movable body 204 forming an annular volume therebetween. In some embodiments, the annular volume includes cooling channels. The dynamic gas assist 110 is coupled to the lid 107 of the process chamber via fasteners 212.

The split wing 206 and barrier plate 202 divides a volume within the movable body in half along a diameter of the movable body 204. The split wing 206 is rotatable and coupled to the movable body 204 such that the split wing 206 rotates along an axis (e.g., parallel to the Z-axis) that is perpendicular to the longitudinal axis (e.g., parallel to Y-axis) of the movable body 204. The barrier plate 202 is positioned between the base of the split wing 206 and the gas baffle 108.

The rotation of the split wing 206 within the movable body 204 controls the amount of gas flow in each respective half of the movable body 204. The rotation of the movable body 204 within the outer housing 208 controls the direction of gas flow out from the movable body 204 through the gas baffle 108 and into the process chamber 101. Aspects of the dynamic gas assist 110 enables real-time control, cleaning, and end point detection for the time of cleaning. A radius ($R_s$) of the split wing 306 extends from the rotational axis of the split wing 306 to the distal end of the split wing 306. The radius ($R_b$) of the movable body 204 is defined from the rotational axis of the movable body to an inner surface of the movable body 204. A ratio of $R_b$ to $R_s$ can be about 10:1 to about 3:2, such as about 10:3 to about 1:2.

Figure 2B:
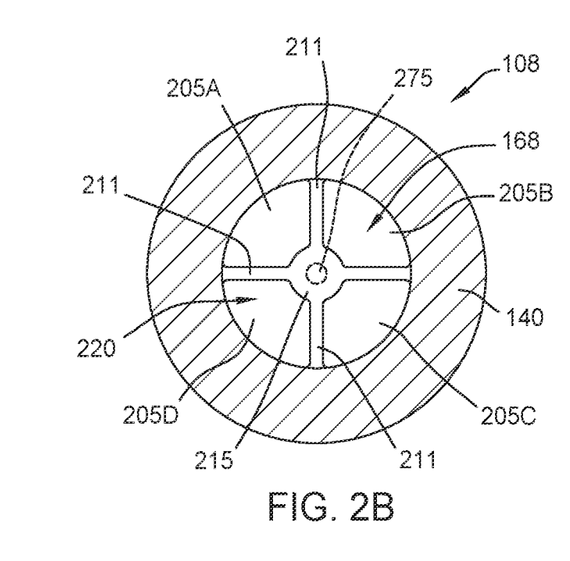
FIG. 2B schematically illustrates a gas baffle, according to some embodiments.

As shown in FIG. 2B, the gas baffle 108 includes a plurality of openings 205A-205D. Each of the openings 205A-205D is separated by a spoke 211. Each of the spokes 211 are joined in a geometric center of the backing plate 140 at a hub 215. The hub 215 includes an apex 275 that proximate to the dynamic gas assist. Each of the spokes 211, formed from the material of the backing plate 140, include a cross structure 220. Each of the openings 205A-205D are provided in quadrants separated by the spokes 211. Each of the openings 205A-205D are sized to maximize gas flow or conductance. In one embodiment, the spokes 211 are positioned at 90 degree intervals within the cross structure 220. In one embodiment, the spokes 211 are substantially straight along the length direction.

Figure 3:
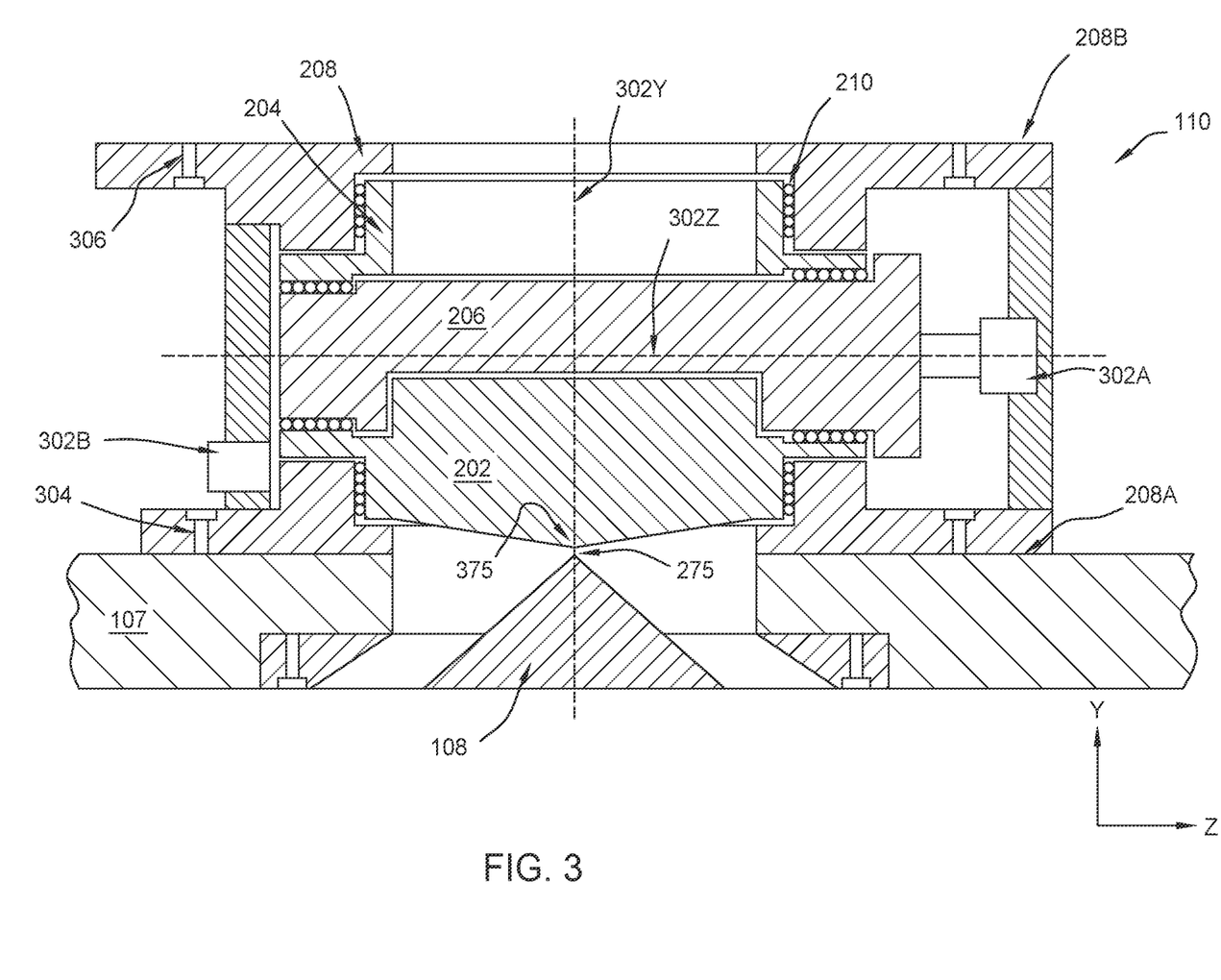
FIG. 3 schematically illustrates a second side view of a dynamic gas assist, according to some embodiments.

FIG. 3 schematically illustrates a second side view of a dynamic gas assist, according to some embodiments. The dynamic gas assist 110 depicted in FIG. 3 can be the dynamic gas assist 110 depicted in FIG. 2A rotated 90 degrees. The dynamic gas assist 110 is made from any material that is resistant (e.g., not corrosive) to cleaning gases (e.g., fluorine-containing gases), such as an aluminum-containing material, such as aluminum alloy, anodized aluminum alloy, $Al_2O_3$ ceramic, or combinations thereof. The housing 208 includes a first major surface 208A that is coupled with the lid 107 of the process chamber 101 via fasteners 304 and a second major surface 208B that interfaces a conduit coupled to a remote plasma source via fasteners 306.

The split wing 206 is in a vertical position and is substantially coplanar with the barrier plate 202. In some embodiments, the split wing 206 is composed of an anodized material, such as an anodized aluminum alloy in order to minimize fluorine recombination. The split wing 206 is coupled to a first motor 302A. The first motor 302A actuates the split wing 206 to tilt or rotate about an axis 302Z, which is parallel to the Z-axis. The movable body 204 is coupled to a second motor 302B, which actuates the movable body 204 to rotate about a longitudinal axis 302Y, which is parallel to the Y-axis. An apex 375 of the barrier plate is proximate to an apex 275 of the gas baffle 108. Each of the first and second motors can be servo motors communicatively coupled to the feedback system described herein.

The feedback system may be connected between the one or more sensors and the dynamic gas assist 110 such that the gas baffle 108 operates by responding to the light intensity information detected by the one or more sensors 116. The one or more sensors 116 may be used by the feedback system to determine regions of lower clean rate in the process volume 102. The feedback system can then use a motor system (e.g., first and second motor) coupled to the dynamic gas assist 110 to control operating times and conditions, such as redirecting and increasing the flow of cleaning gas towards the zones of lower cleaning rate to increase the clean rate in the respective zones.

The feedback system may also be connected to the CPU 122 for cleaning end-point detection. The CPU 122 can be communicatively coupled to the remote plasma source 112 and/or the gas source 114 and is capable of stopping the cleaning process when the light intensity detected by the one or more photo sensors reaches a predetermined intensity.

Figure 4:
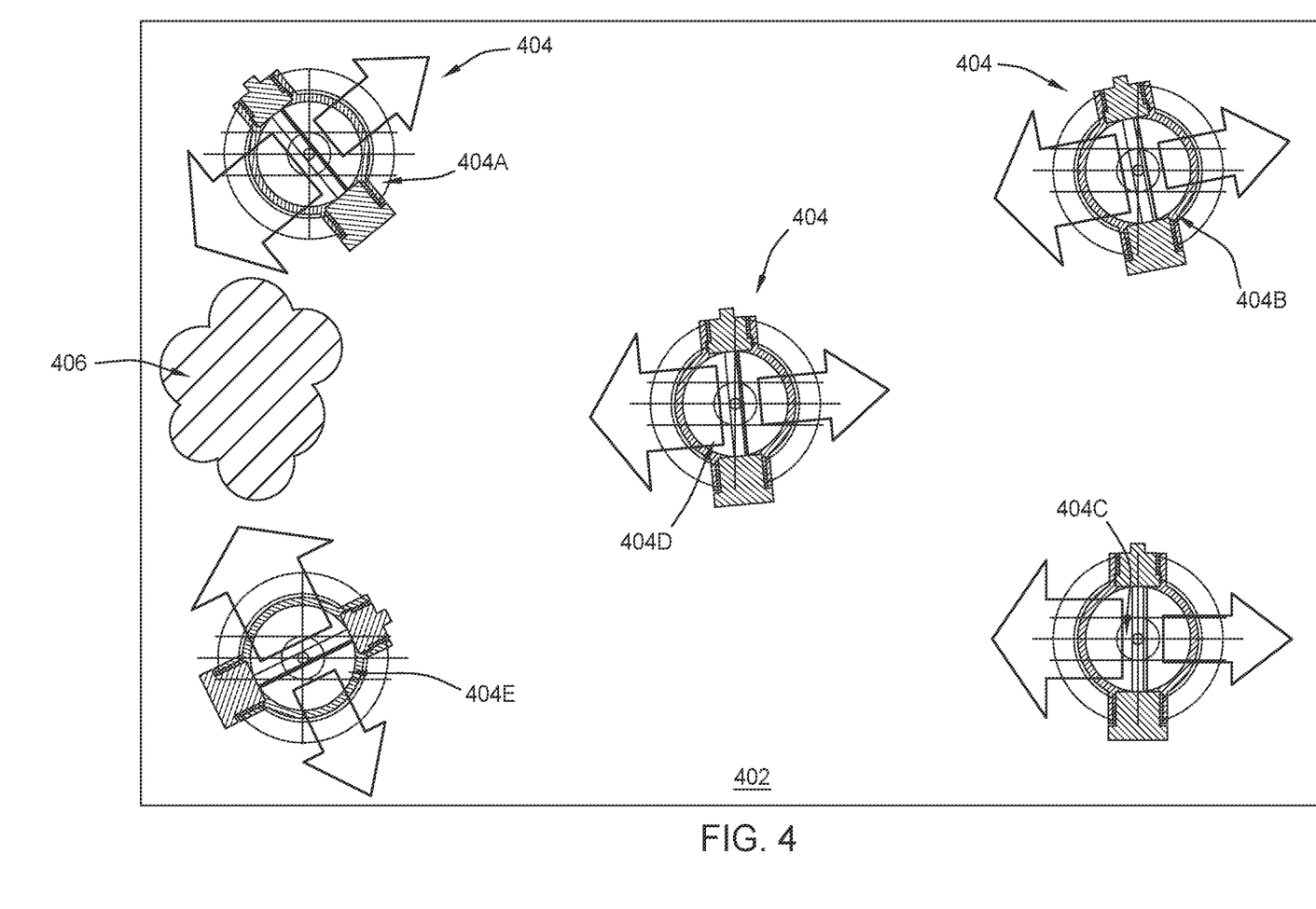
FIG. 4 schematically illustrates a top view of a process chamber, according to some embodiments.

FIG. 4 schematically illustrates a top view of a process volume 402 coupled to five dynamic gas assists (e.g., 404A, 404B, 404C, 404D, 404E, collectively 404), according to some embodiments. During cleaning, a light intensity is highest in zone 406 depicted in FIG. 4, which can be detected using one or more sensors 116. Each of the dynamic gas assists 110 have movable bodies 204 that are rotated and split wings 206 that are tilted such that gas flow is concentrated in the direction of zone 406. In some embodiments, one or more of the dynamic gas assists, such as 404B and 404C, can be closed such that no gas is provided through the selected dynamic gas assists. Selectively controlling each dynamic gas assist at various zones of the process volume enables enhanced cleaning control. Although five dynamic gas assists are depicted in FIG. 4, other number of dynamic gas assists are also contemplated such as a single centrally located dynamic gas assist, or additional dynamic gas assists depending on the size of the process chamber.

Figure 5:
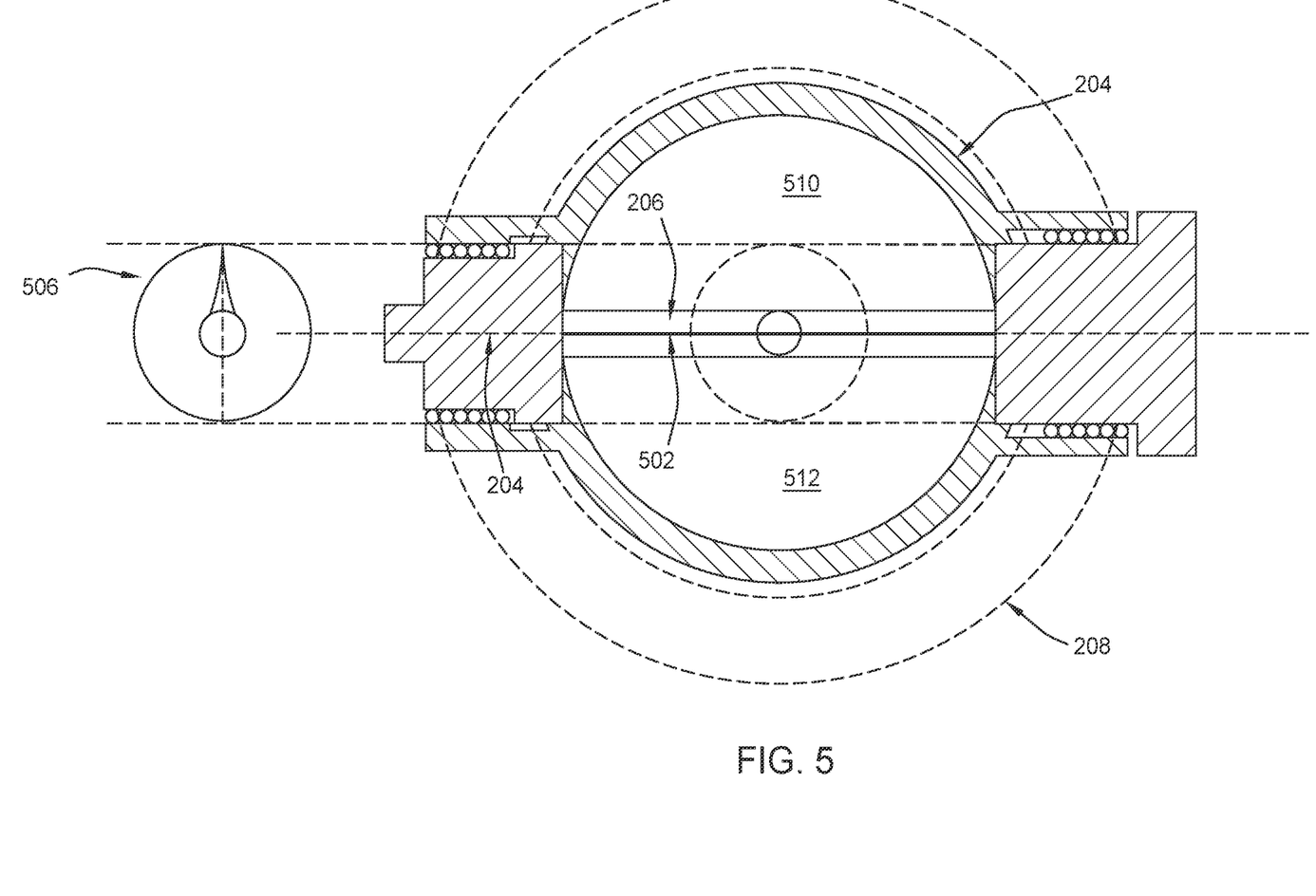
FIG. 5 schematically illustrates a top view of a dynamic gas assist in a first position, according to some embodiments.

FIG. 5 schematically illustrates a top view of a dynamic gas assist 110, according to some embodiments. The split wing 206 bisects a volume of the movable body 204 into a first volume 510 and a second volume 512. The split wing 206 is disposed in a vertical position as indicated by an angle guide 506 and a reference line 502. The reference line 502 is disposed at a center of a top edge thickness of the split wing 206. The angle guide 506 is oriented at a zero degree position. A cleaning gas flows through the volume equally between the first volume 510 and the second volume 512 due to the vertical orientation of the split wing 206. The movable body 204 is angled at a first position such that the cleaning gas is directed to first and second zones of the process volume. The first zone receives cleaning gas via the first volume 510 of the movable body and the second zone receives cleaning gas via the second volume 512 of the movable body.

Figure 6:
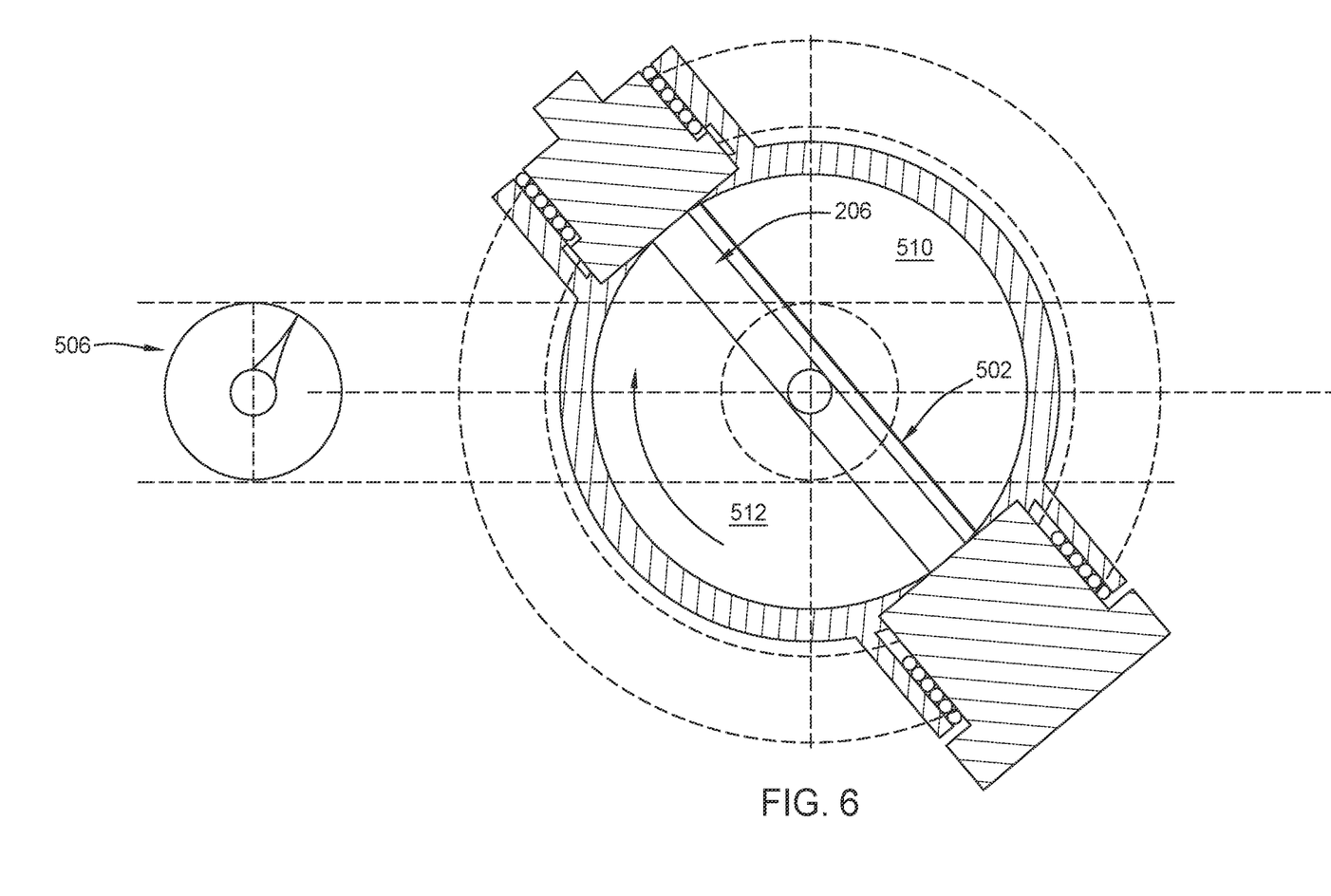
FIG. 6 schematically illustrates a top view of a dynamic gas assist in a second position, according to some embodiments.

FIG. 6 schematically illustrates a top view of a dynamic gas assist 110, according to some embodiments. The movable body 204 is rotated along a longitudinal axis at a second position rotated clockwise relative to the first position. The second position corresponds to third and fourth zones of the process volume. The third zone receives cleaning gas via the first volume 510 of the movable body and the fourth zone receives cleaning gas via the second volume 512 of the movable body. The split wing 206 is tilted at an angle relative to the vertical direction as indicated by the angle guide 506 and the reference line 502, which is tilted toward or within the first volume 510 of the movable body 204. The tilted angle diverts cleaning gas such that an increased volume of cleaning gas is directed to the second volume 512 corresponding to the fourth zone of the process volume. The volumetric ratio of the first to second volume of the movable body can be controlled by controlling a tilt angle (e.g., as shown in the angle guide 506) of the split wing 206. The gas flow ratio between the first and second volumes can be about 10:1 to about 1:10, such as about 5:1 to about 3:1, or about 1:3 to about 1:1, or about 1:5 to about 1:3, by total volumetric flow through the movable body. For example, a 30 degree rotation will create a gas flow ratio between the first and second volumes of about 2:1 to about 3:2 by total volumetric flow through the movable body in which the movable body radius ($R_b$) to split wing radius ($R_s$) is about 10:4. In particular, the ratio can be calculated by determining a total cross-sectional area ($A_b$) of the movable body (e.g., $A_b = \pi \times R_b^2$) and a cross-sectional area of each hemisphere when the split wing is at a verticle position (e.g., $A_1$ (at $\theta=0$) = $A_2$ (at $\theta=0$) = $A_b/2$). A cross-sectional area of the split wing at an angled position (e.g., at $\theta=30$ degrees) can be calculated by determining the cross-sectional thickness of the split wing (e.g., at $\theta=30$ the thickness is about $R_s/2$). The cross-sectional area of the split wing from the top down view is about $A_s = 2 \times R_b \times R_s/2$. The volumetric split between the first and second volumes at $\theta=30$ degrees corresponds to the ratio of the cross-sectional hemispheres at θ=30 degrees, where $A_1$(at θ=30)=$A_1$(at θ=0)+$A_s$ and $A_2$(at θ=30)=$A_2$(at θ=0)−$A_s$. The volumetric gas flow split is therefore about $A_1$(at θ=30): $A_2$(at θ=30).

Although a single split wing is depicted, additional split wings are also contemplated, such as a second split wing perpendicular to the first split wing to separate the volume into quadrants or additional volumes.

Figure 7A:
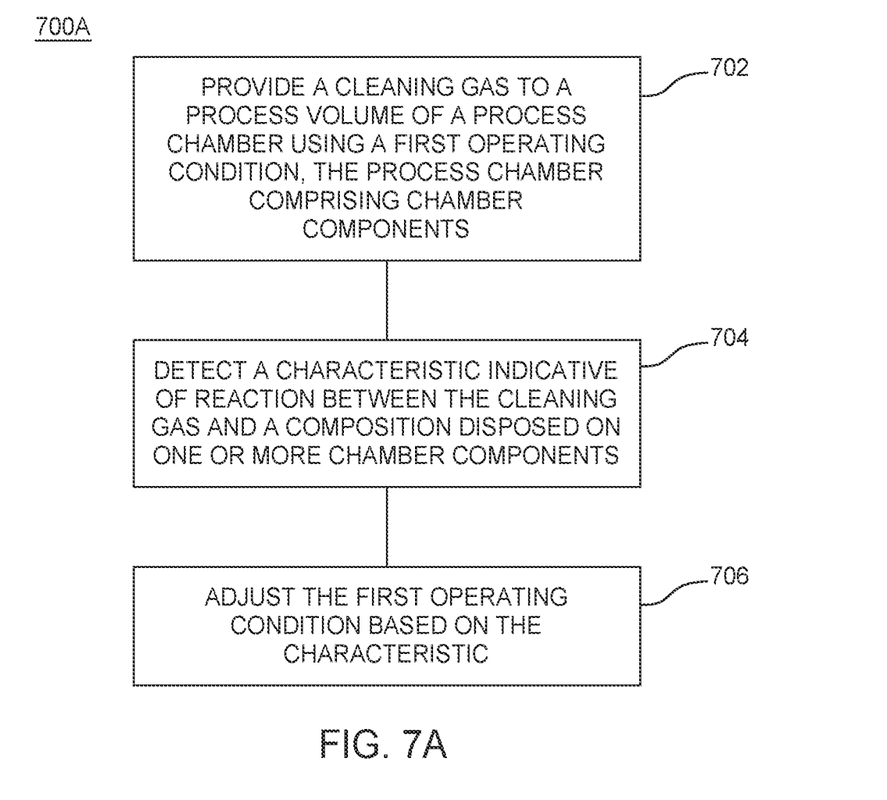
FIG. 7A depicts a process flow diagram of a method, according some embodiments.
Figure 7B:
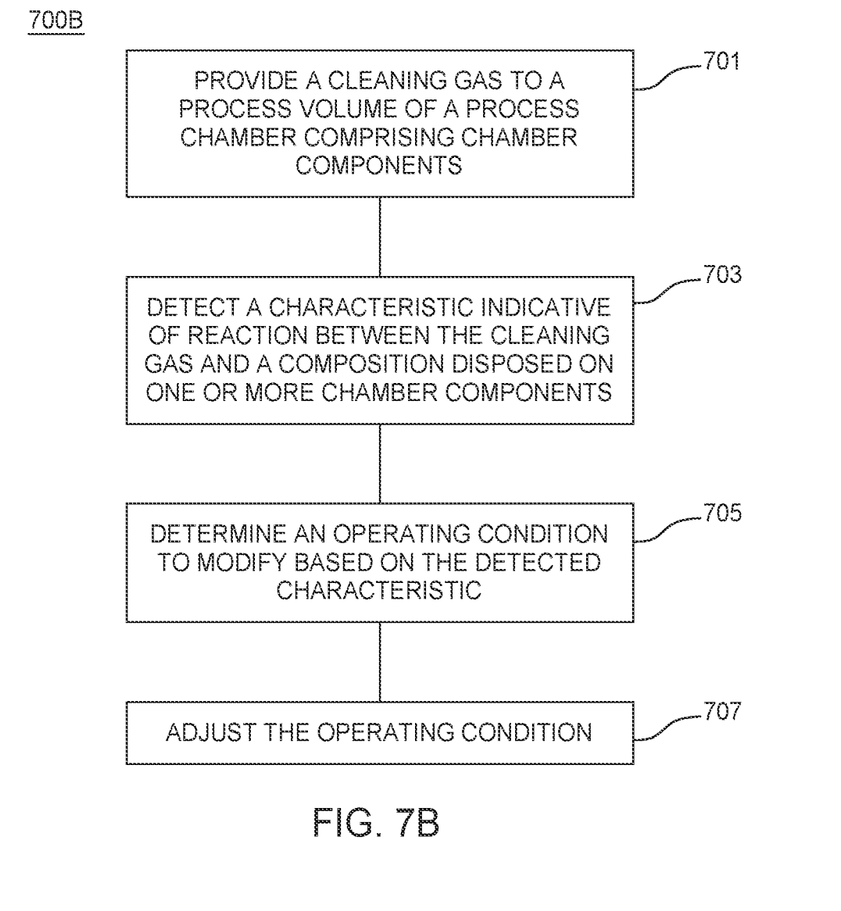
FIG. 7B depicts a process flow diagram of a method, according some embodiments.

FIG. 7A and FIG. 7B depict process flow diagrams of methods 700A, 700B of cleaning process chamber components, according some embodiments. The systems and apparatus described relative to FIG. 1 to FIG. 6 are suitable for use be used to perform the methods 700A, 700B described in FIG. 7A and FIG. 7B. Other systems and apparatuses are also contemplated.

The method 700A includes, at activity 702, providing a cleaning gas to a process volume of a process chamber using a first operating condition. The process chamber includes chamber components, such as one or more side walls 105, a lid 107, a substrate support 104, a gas baffle 108, or combinations thereof. The first operating condition can be a gas flow rate, a gas flow direction, a gas flow ratio between two or more zones of a dynamic gas assist 110.

Other operating conditions can include adjusting a chamber pressure by adjusting a valve from a first position to a second position, such as a fully open position to a partially open position to maximize the cleaning rate. Other operating conditions can include adjusting the spacing between the gas distribution assemblty 106 and substrate support 104.

In some embodiments, the total gas flow rate can be about 30 slm to about 70 slm, such as about 40 slm to about 60 slm. The cleaning gas is provided to the process volume by energizing nitrogen trifluoride from a gas source to form fluorine radicals within a remote plasma source and providing the fluorine radicals to the process volume. The fluorine radicals are reacted with the composition to remove the composition from one or more of the chamber components.

The cleaning gas is provided from one or more remote plasma sources to the process volume via a dynamic gas assist. The dynamic gas assist includes a movable body disposed within a housing. The housing is concentric with the movable body. A split wing bisects the movable body and is movable along an axis perpendicular to the longitudinal axis of the movable body. The split wing can be rotated or tilted in either direction along the axis perpendicular to the longitudinal axis of the movable body. The dynamic gas assist further includes a barrier plate coupled to the movable body and disposed adjacent to the split wing.

In some embodiments, the total gas flow rate can be split between two or more volumes within the dynamic gas assist. The direction and the ratios of gas flow rates between the volumes can be tuned by rotating a movable body of the dynamic gas assist and/or tilting a split wing of the dynamic gas assist.

The method 700A includes, in activity 704, detecting a characteristic indicative of reaction between the cleaning gas and a composition disposed one or more chamber components. The composition can be any of the film compositions described herein, such as a silicon-containing composition, such as silicon nitride. In some embodiments, the characteristic is a light intensity emitted during reaction of the cleaning gas and the composition. Detecting the characteristic can include detecting a first light intensity at a first zone of the process volume and detecting a second light intensity at a second zone of the process volume. Other characteristics are also contemplated, such as reflectivity, emissivity, eddy current values; electrical resistivity, or characteristics of a visual image.

The method 700A includes, in activity 706, adjusting the first operating condition based on the characteristic. In some embodiments, the first operating condition includes a gas flow distribution of the cleaning gas within one or more zones of the process volume. In some embodiments, the method further includes diverting a gas flow direction of the cleaning gas from the first zone to the second zone. The first light intensity is lower than the second light intensity.

The method 700B depicted in FIG. 7B includes, at activity 701, providing a cleaning gas to a process volume of a process chamber with process chamber components disposed therein as described in activity 702 of FIG. 7A. The cleaning gas is configured to clean a composition disposed on the process chamber components. During cleaning, in activity 703, a characteristic is detected that is indicative of reaction between the cleaning gas and the composition disposed on one or more of the chamber components. In activity 705, an operating condition of providing the cleaning gas is determined to be modified based on the characteristic. In some embodiments, the characteristic is a light intensity difference between a first and second zone of the process zone. In particular, a light intensity in a first zone can be higher than the second zone which would signal reducing cleaning gas to the second zone relative to the first zone.

In some embodiments, the operating condition to be modified is a total cleaning gas flow rate to the process volume, a cleaning gas flow ratio to a first zone relative to a second zone, a total time of cleaning, a composition of the cleaning gas, or combinations thereof. In activity 707, the operating condition is adjusted to tune cleaning of the chamber components.

Figure 8:
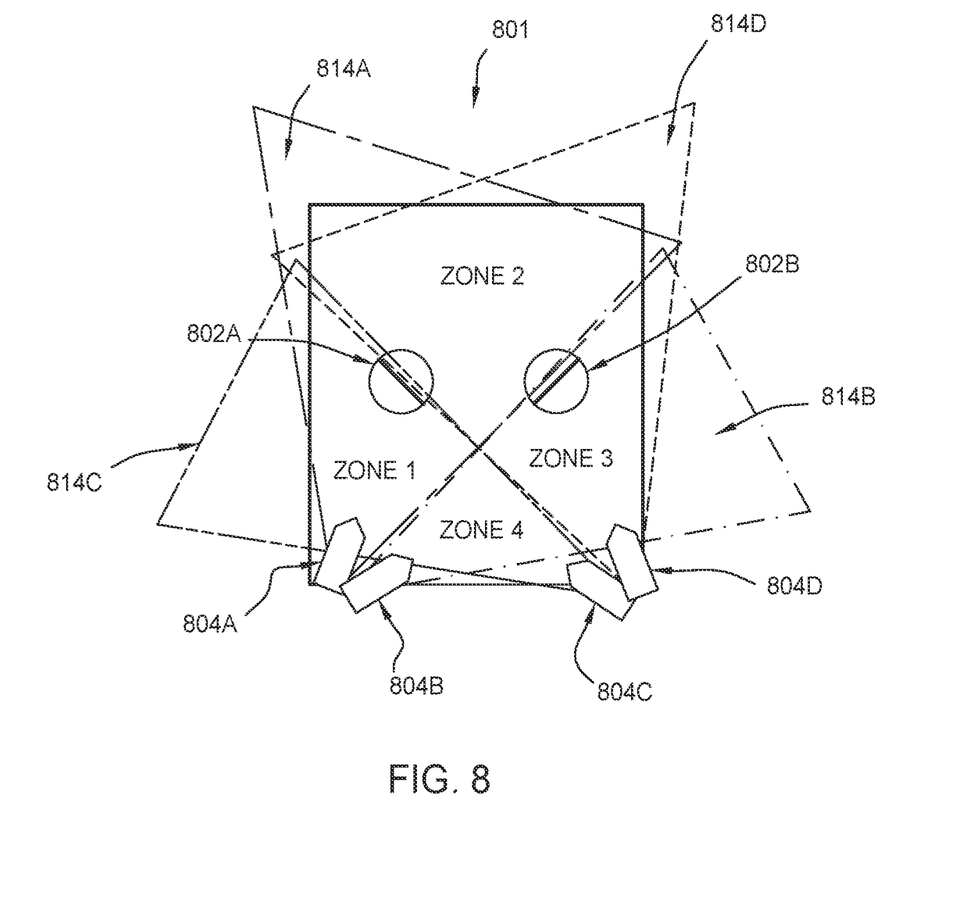
FIG. 8 schematically illustrates a top view of a process volume, according to some embodiments.

FIG. 8 schematically illustrates a top view of a process volume 801, according to some embodiments. The process volume 801 includes two dynamic gas assists 802A, 802B and four sensors 804A, 804B, 804C, 804D. Each of the sensors are oriented in predetermined directions to monitor a characteristic in different zones of the process volume, such as zone 1, zone 2, zone 3, and zone 4. Each of the sensors are capable of monitoring characteristics in one or more of the zones. By way of example, sensor 804A is capable of monitoring a sensing area 814A, sensor 804B is capable of monitoring a sensing area 814B, sensor 804C is capable of monitoring a sensing area 814C, and sensor 804D is capable of monitoring a sensing area 814D. One or more sensing areas can overlap one or more zones. Sensor readings can be compared or cross referenced with one another to determine zones within the process volume that require additional cleaning. In particular, if sensor 804A and sensor 804D detect high light intensity, it can be inferred that Zone 2 is in need of further cleaning. One or both of the dynamic gas assists 802A, 802B can be tuned to direct more gas flow to Zone 2. Similarly, if a single dynamic assist is centered over the process volume, the single dyanamic assist can be directed in real time, or substantially in real time to zones with higher light intensity readings.

The methods and systems described herein enable dynamic control of cleaning gas to zones of process volumes for enhanced cleaning and efficient use of cleaning gases. The cleaning rate for each zone can be controlled to enable uniform cleaning rates amongst of the process volume zones.

While the foregoing is directed to embodiments of the present disclosure, other and further embodiments of the

What we claim is:

1. A system, comprising:
   a process chamber comprising a substrate support disposed within a chamber volume of the process chamber;
   a gas distribution assembly facing the substrate support;
   a gas baffle fluidly coupled to the gas distribution assembly;
   a sensor coupled to the process chamber and configured to monitor at least one characteristic of the volume of the process chamber; and
   a dynamic gas assist fluidly coupled to the gas baffle and communicatively coupled to the sensor, the dynamic gas assist comprising:
      a movable body disposed within a housing, the housing concentric with the movable body;
      a split wing bisecting the movable body and movable along an axis perpendicular to a longitudinal axis of the movable body; and
      a barrier plate coupled to the movable body and disposed adjacent to the split wing.

2. The system of claim 1, wherein the dynamic gas assist is configured to be coupled to a cleaning gas source.

3. The system of claim 1, wherein the dynamic gas assist comprises a plurality of assemblies, each assembly coupled to the process chamber at different locations, each assembly in fluid communication with one or more remote plasma sources.

4. The system of claim 1, wherein the movable body is rotatable about a center longitudinal axis of the movable body.

5. The system of claim 1, wherein the system further comprises a plurality of sensors, each sensor positioned and oriented to monitor a zone of the chamber volume.

6. The system of claim 5, wherein a first sensor of the plurality of sensors is configured to monitor a first zone of the chamber volume and a second sensor of the plurality of sensors is configured to monitor a second zone of the chamber volume, wherein the first and second zones partially overlap with one another.

7. The system of claim 1, wherein the split wing is coupled to the movable body, the split wing configured to tilt about an axis perpendicular to a longitudinal axis of the movable body.

8. The system of claim 1, wherein the dynamic gas assist further comprises a first motor configured to actuate the movable body and a second motor configured to actuate the split wing.

9. The system of claim 1, wherein the gas baffle comprises:
   a backing plate having a central bore formed therethrough; and
   an integrated cross structure formed in the central bore, the cross structure forming a plurality of openings.

10. An apparatus for distributing cleaning gases to a process volume of a semiconductor process chamber, the apparatus comprising:
    a movable body disposed within a housing, the housing concentric with the movable body;
    a split wing bisecting the movable body and movable along an axis perpendicular to a longitudinal axis of the movable body; and
    a barrier plate coupled to the movable body and disposed adjacent to the split wing.

11. The apparatus of claim 10, wherein the housing comprises:
    a first major surface having a one or more apertures for fastening the first major surface to a lid of a process chamber; and
    a second major surface opposing the first major surface and configured to be coupled to a remote plasma source.

12. The apparatus of claim 11, wherein the barrier plate comprises a first edge adjacent to the first major surface of the housing and a second edge adjacent substantially parallel to an edge of the split wing.

13. The apparatus of claim 12, wherein the first edge forms an apex, wherein the barrier plate has a maximum height at a center of the barrier plate.

14. The apparatus of claim 10, further comprising a first motor coupled to the movable body and a second motor coupled to the split wing.

15. A method of cleaning semiconductor deposition chamber components, the method comprising:
    providing a cleaning gas to a process volume of a process chamber using a first operating condition, the process chamber comprising:
       a movable body disposed within a housing, the housing concentric with the movable body;
       a split wing bisecting the movable body and movable along an axis perpendicular to a longitudinal axis of the movable body; and
       a barrier plate coupled to the movable body and disposed adjacent to the split wing;
    detecting a characteristic indicative of reaction between the cleaning gas and a composition disposed on one or more chamber components; and
    adjusting the first operating condition based on the characteristic, the first operating condition comprising a gas flow distribution of the cleaning gas within one or more zones of the process volume, the adjusting includes adjusting at least one of the movable body, the barrier plate, or the split wing.

16. The method of claim 15, wherein the characteristic is a light intensity emitted during reaction of the cleaning gas and the composition.

17. The method of claim 15, wherein detecting the characteristic comprises:
    detecting a first light intensity at a first zone of the process volume; and
    detecting a second light intensity at a second zone of the process volume.

18. The method of claim 17, further comprising diverting a gas flow direction of the cleaning gas from the first zone to the second zone, wherein the first light intensity is lower than the second light intensity.

19. The method of claim 15, wherein providing the cleaning gas comprises energizing nitrogen trifluoride to form fluorine radicals and reacting the fluorine radicals with the composition to remove the composition from one or more of the chamber components.

* * * * *